(12) United States Patent
Steiner et al.

(10) Patent No.: US 11,082,069 B1
(45) Date of Patent: Aug. 3, 2021

(54) DECODING SCHEME FOR ERROR CORRECTION CODE STRUCTURE IN DATA STORAGE DEVICES

(71) Applicant: Kioxia Corporation, Tokyo (JP)

(72) Inventors: Avi Steiner, Kiriat Motzkin (IL); Hanan Weingarten, Herzliya (IL)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/843,774

(22) Filed: Apr. 8, 2020

(51) Int. Cl.
 *H03M 13/00* (2006.01)
 *H03M 13/15* (2006.01)
 *H03M 13/39* (2006.01)
 *H03M 13/11* (2006.01)

(52) U.S. Cl.
 CPC ..... *H03M 13/152* (2013.01); *H03M 13/1105* (2013.01); *H03M 13/1575* (2013.01); *H03M 13/3927* (2013.01)

(58) Field of Classification Search
 None
 See application file for complete search history.

(56) References Cited

U.S. PATENT DOCUMENTS

| | | | | |
|---|---|---|---|---|
| 7,502,982 B2* | 3/2009 | Silvus | ............... | H03M 13/2966 714/753 |
| 2004/0140915 A1* | 7/2004 | Shen | ................. | H03M 13/2975 341/50 |
| 2007/0043998 A1* | 2/2007 | Lakkis | ................. | H03M 13/116 714/758 |
| 2008/0301523 A1* | 12/2008 | Eudes | ............... | H03M 13/3738 714/758 |
| 2009/0150746 A1* | 6/2009 | Chaichanavong | ........................... | H03M 13/6561 714/752 |
| 2014/0153625 A1* | 6/2014 | Vojcic | ................. | G06F 11/1625 375/224 |
| 2015/0039962 A1* | 2/2015 | Fonseka | ............ | H03M 13/2906 714/755 |
| 2016/0373133 A1* | 12/2016 | Karar | ................ | H03M 13/6325 |

* cited by examiner

*Primary Examiner* — Mujtaba M Chaudry
(74) *Attorney, Agent, or Firm* — Foley & Lardner LLP

(57) ABSTRACT

Various implementations described herein relate to systems and methods for decoding data stored in a non-volatile storage device, including determining features for each of a plurality of component codes corresponding to the data by decoding each of the plurality of component codes, determining an extrinsic value output for each of the component codes based on the features, and after the extrinsic value output for each of the component codes is determined, decoding each of the plurality of component codes based on the extrinsic value outputs of all other component codes of the component codes. Each of the component codes depends on all other component codes.

20 Claims, 6 Drawing Sheets

DECODING SCHEME FOR ERROR CORRECTION CODE STRUCTURE IN DATA STORAGE DEVICES

TECHNICAL FIELD

The present disclosure relates generally to systems and methods for soft decoding for correcting errors in data storage devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP).

A code rate is defined by a ratio of information content (referred to as a "payload") of a codeword to an overall size of the codeword. For example, for a code that contains k bits and r redundancy bits, the code rate $R_c$ is defined by $$R_c = \frac{k}{k+r}.$$

Conventional encoding methods are not well suited to support codes having high code rates for both hard decoding and soft decoding. For example, conventional low-density parity-check (LDPC) codes that have high code rates (e.g., 0.9) have considerably long code length, resulting in complex and costly implementations.

SUMMARY

In certain aspects, the present implementations are directed to a method for decoding data stored in a non-volatile storage device, including determining features for each of a plurality of component codes corresponding to the data by decoding each of the plurality of component codes, determining an extrinsic value output for each of the component codes based on the features, and after the extrinsic value output for each of the component codes is determined, decoding each of the plurality of component codes based on the extrinsic value outputs of all other component codes of the component codes. Each of the component codes depends on all other component codes.

In some aspects, the present implementations are directed to an error correction system configured to determine features for each of a plurality of component codes corresponding to the data by decoding each of the plurality of component codes, determine an extrinsic value output for each of the component codes based on the features, and after the extrinsic value output for each of the component codes is determined, decode each of the plurality of component codes based on the extrinsic value outputs of all other component codes of the component codes. Each of the component codes depends on all other component codes.

In some aspects, the present implementations are directed to a non-transitory computer-readable medium storing computer-readable instructions, such that when executed, causes a processing circuit to decode data stored in a non-volatile storage device by determine features for each of a plurality of component codes corresponding to the data by decoding each of the plurality of component codes, determining an extrinsic value output for each of the component codes based on the features, and after the extrinsic value output for each of the component codes is determined, decoding each of the plurality of component codes based on the extrinsic value outputs of all other component codes of the component codes. Each of the component codes depends on all other component codes.

DETAILED DESCRIPTION

Figure 1:
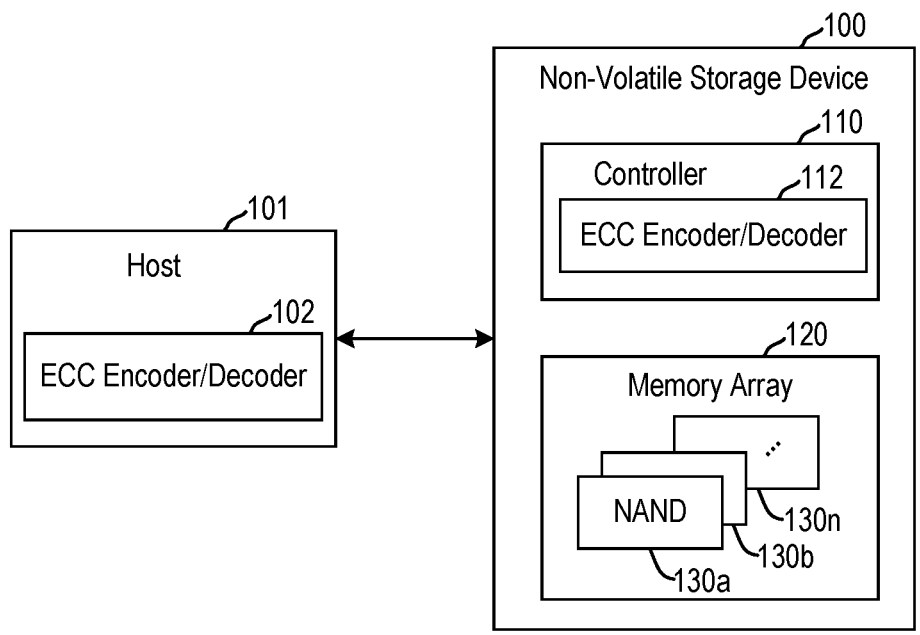
FIG. 1 shows a block diagram of examples of a system including a non-volatile storage device and a host, according to some implementations.

Arrangements disclosed herein relate to systems, apparatuses, methods, and non-transitory computer-readable media for providing storage devices with improved endurance and reliability by implementing a soft decoding scheme for ECC structures. Examples of such storage devices include but are not limited to, flash memory devices, e.g., quad-level cell (QLC) NAND flash memory devices, and so on. The soft decoding scheme can be implemented using half product codes, e.g., half folded-product code (HFPC), which enables high code when deployed in NAND flash memory devices. Soft decoding based on the ECC structure enables high endurance and improved resilience to retention and read-disturb stresses. Improved decode reliability with low read and decode complexity can be achieved due to the decoding capabilities of each component code of the ECC structure.

In some arrangements, a code construction as described herein is based on simple component codes (such as but not limited to, Bose-Chaudhuri-Hocquenghem (BCH) components) which can be implemented efficiently. The component codes implement iterative decoding. Therefore, the code construction has a more cost-effective implementation as compared to conventional codes (e.g., the LDPC codes) that have complex and costly implementations. This allows the code structure to be suitable for storage applications for flash memory devices (e.g., NAND flash memory devices and controllers thereof).

The multi-dimensional encoding using such component codes can enable improved encoding/decoding throughput and efficiency with low implementation complexity for both hard input or soft input to the decoder. That is, the ECC structure described herein can provide high error correction capabilities for both hard decoding and soft decoding. For example, the ECC structure can enable high raw bit error rate (RBER) error correction with hard input to the decoder (hard decoding) and can provide high throughput at low implementation complexity. This improves the error correction capabilities of storage systems given that storage systems typically implement a single-read operation. Therefore, high performance on read operations for a storage device can be achieved throughout a lifespan of the storage device.

In some implementations, the code rate of the ECC structure can be configured for each application. For example, a single engine can configure (with firmware) the code parameters to determine the payload size and redundancy size of the ECC in the manner described. This allows using different codes for different type of pages, for example, according to RBER characteristics of the pages. Alternatively, the payload size can be determined in a manner to optimize the tradeoff between performance and reliability.

In addition, the ECC structure can enable high RBER error correction with soft input to the decoder (soft decoding), providing high reliability at high program-erase (P/E) cycle counts and in difficult retention conditions, as storage systems typically require a very small uncorrectable bit error rate (LIBER) (e.g., 1E-15).

In some arrangements, the ECC structure uses multi-dimensional encoding. In multi-dimensional encoding, a stream of data is passed through a set of multiple component encoders (implemented or otherwise included by a controller) which together encode the full payload into a single codeword. BCH encoding can be performed by passing systematic data of the code through a shift register of a controller. Therefore, the systematic data can simply pass through the component encoders of the controller without being modified while the shift-register advances. After the systematic data being completely passed through the shift-register, the content of the shift register is the redundancy of the code and is appended to the data stream. The same characteristics are applicable to all component encoders in all dimensions. Multi-dimensional encoding can be obtained with product codes or symmetric product codes and may provide improved capabilities. Such structures create a product of component codes to obtain a full codeword. As such, the decoding process can include iterative decoding of the component codes.

To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes one or more dies, each of which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some implementations, the ECC encoders of the ECC encoder/decoder 102 are configured to encode data (e.g. input payload) to be written to multiple instances of the non-volatile storage device 100 using a redundancy code, examples including, but not limited to, erasure codes and RAID levels 0-6.

An encoding scheme such as the HFPC encoding scheme can be used to encode each of the plurality of short codewords. In some arrangements, the HFPC code structure is composed of multiple component codes. Each component code can be, for example, a BCH code. A number of components code n can be determined by the correction capability of each component code and code rate. For example, given a minimum distance $D_{min}$ per component code, the correction capability t of each component code can be represented by:

$$t = (D_{min}-1)/2 \quad (1);$$

where the $D_{min}$, of a linear block code is defined as the smallest Hamming distance between any pair of code vectors in the code. The number of redundancy bits r can be represented by:

$$r = Q \cdot (D_{min}-1)/2 \quad (2);$$

where Q is a Galois field parameter for the BCH component code defined over $GF(2^Q)$. Given a code rate R and payload length K bits, a number of component codes needed can be determined by:

$$n = \left\lfloor K \cdot \frac{1-R}{r \cdot R} \right\rfloor; \text{ or} \quad (3)$$

$$n = \left\lfloor 2K \cdot \frac{1-R}{Q \cdot (D_{min}-1) \cdot R} \right\rfloor. \quad (4)$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 2:
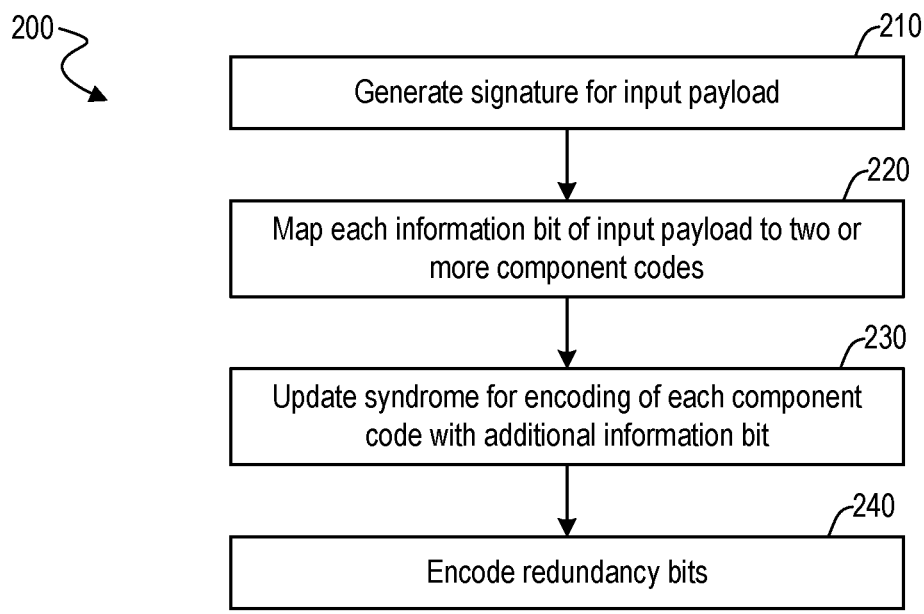
FIG. 2 is a process flow diagram illustrating an example encoding/decoding method, according to some implementations.

For example, FIG. 2 is a process flow diagram illustrating an example of an encoding method 200 according to some implementations. Referring to FIGS. 1-2, the method 200 encodes an input payload to obtain a corresponding ECC as described herein. The input payload includes information bits.

At 210, one or more encoders of the ECC encoder/decoder 102 or 112 generate a signature for the input payload. The signature can be used during decoding to check whether decoding is successful. In some examples, the signature can be generated by passing the information bits through a hash function. In some examples, the signature includes a cyclic redundancy check-sum (CRC) generated from the information bits. In some examples, in addition to the CRC, the signature can include other indications generated from the input payload. The CRC can be generated to have a designated length. The length of the CRC can be determined based on factors such as but not limited to, target misdetection probability of the codeword decoding, misdetection probability of decoding process (alone without the CRC), and so on. Misdetection probability of the codeword decoding refers to the probability of signaling-out a "decode success" despite the existence of decode errors. Misdetection probability of decoding process (alone without the CRC) refers to the probability of signaling-out a "decode failure" despite the absence of decode errors. Some level of confidence for decoding can be provided using the component codes zero syndromes, which in some cases may be sufficient to allow a zero-length CRC. Otherwise, the CRC can be used for a combined misdetection decision. For instance, longer length of the CRC corresponds to a low misdetection probability of the codeword decoding. On the other hand, shorter length of the CRC corresponds to high target misdetection probability of the codeword decoding.

At 220, the one or more encoders of the ECC encoder/decoder 102 or 112 map each information bit of the input payload to two or more component codes. In some examples, the bits corresponding to the signature (e.g., the CRC bits) can also encoded (e.g., each CRC bit can be mapped to one or more component codes in the arrangements in which the ECC is a regular HFPC). That is, the one or more encoders of the ECC encoder/decoder 102 or 112 implement a mapping function that maps each information bit of the input payload with corresponding component codes of the ECC. In the arrangements in which the ECC is a regular HFPC (e.g., FIG. 3), each information bit can be mapped to two component codes (e.g., i1 and i2). In the arrangements in which the ECC is an irregular HFPC, at least one information bit can be mapped to three or more component codes, thus creating an irregular encoding process.

Blocks 210 and 220 can be implemented simultaneously or in parallel in some examples. In other examples, blocks 210 and 220 can be implemented sequentially in any suitable order. The ECC code structure is composed of multiple component codes. Each component code can be, for example, a BCH code.

At 230, the one or more encoders of the ECC encoder/decoder 102 or 112 update a syndrome for encoding of each component code with an additional information bit. Thus, every component code encodes a portion of the input payload, depending on the mapping function executed at 220. A set of redundancy bits corresponding to the component codes are generated after all payload bits (including the information bits and the signature bits) are encoded per blocks 210-230.

At 240, the one or more encoders of the ECC encoder/decoder 102 or 112 encode the redundancy bits (in an additional encoding process) in some arrangements. That is, the redundancy bits can be mapped to additional component codes. For example, the encoding can be obtained by a similar set of component codes. The set of component codes may be a smaller set than a set of the payload encoding set, for example, for higher code rate. Every redundancy encoding component can receive separate redundancy input bits for encoding. As such, a parity of parity encoding is generated.

Figure 3:
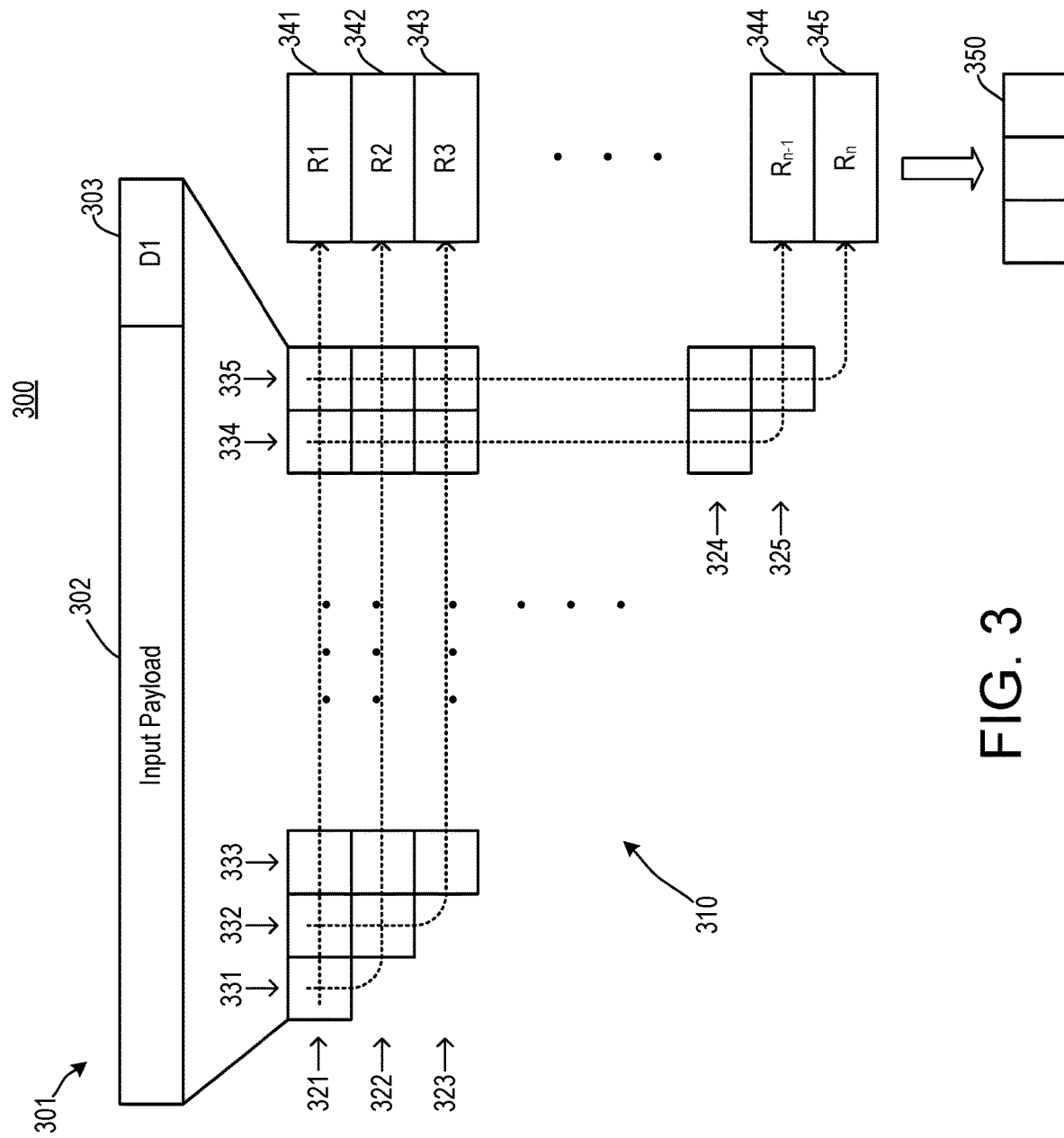
FIG. 3 is a diagram illustrating a mapping in an encoding process using a half folded-product code (HFPC) structure according to various implementations.

FIG. 3 is a diagram illustrating a mapping 300 in an encoding process using a HFPC structure according to various implementations. Referring to FIGS. 1-3, the mapping 300 corresponds to the HFPC encoding scheme and is an example implementation of block 220. The controller 110 (e.g., one or more ECC encoders of the ECC encoder/decoder 112) or the host 101 (e.g., one or more ECC encoders of the ECC encoder/decoder 102) can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. In some examples, the input payload 302 includes information bits and redundancy bits introduced by the host 101 for RAID or erasure encoding (e.g. by the one or more ECC encoders of the ECC encoder/decoder 102). As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one arrangement, the mapping is a one to one mapping, where each bit of the input bits 301 is mapped to one bit of the pseudo triangular matrix 310 and the total number of bits in the pseudo triangular matrix 310 is equal to the number of input bits 301. In another arrangement, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to the right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335).

Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 into a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn-1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the codeword. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIG. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the codeword and resulting in improved correction capabilities (as applied to iterative decoding).

The redundancy bits R1 341-Rn-m 345 generated from the HFPC encoding process described with respect to FIG. 3 can be encoded by another, separate set of component codes used to encode all or a subset of these redundancy bits by another set of component codes. This forms a folded product code encoding over the redundancy bits R1 341-Rn-m 345, which, together with the information bits encoding, results in a low complexity encoding process.

As shown, the bits for each component code depend on the bits for another component code during decoding in the ECC structure corresponding to the mapping 300.

For conventional half product codes, every pair of component codes has only one common (intersection) information bit. In some implementations, a HFPC is obtained by using every pair of component codes encode more than one information bit. Accordingly, there can be two or more common (intersection) bits for every pair of component codes.

In some implementations, the redundancy bits generated from the HFPC encoding process described herein are encoded by a separate set of component codes. For example, the separate set of component codes encode all or a subset of the redundancy bits to form a folded product code that encodes over the redundancy bits, which together with the information bits encoding, results in a low complexity encoding process.

In some implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 4:
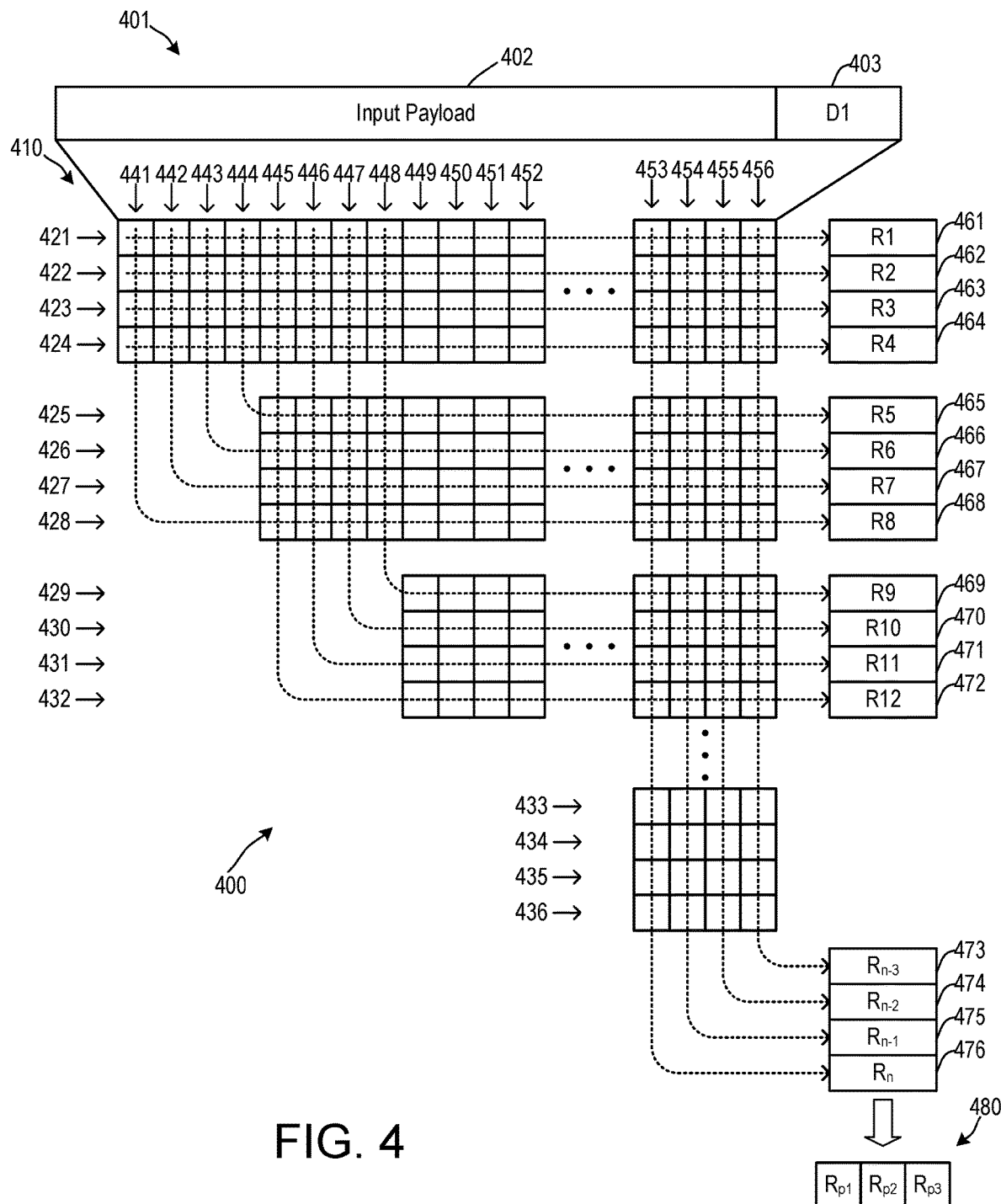
FIG. 4 is a diagram illustrating a mapping in an encoding process using a group HFPC structure according to various implementations.

In that regard, FIG. 4 is a diagram illustrating a mapping 400 in an encoding process using a group HFPC structure according to various implementations. Referring to FIGS. 1-4, the mapping 400 corresponds to the group HFPC encoding scheme and is an example implementation of block 220. The HFPC interleaver of controller 110 (e.g., one or more ECC encoders of the ECC encoder/decoder 112) or the host 101 (e.g., one or more ECC encoders of the ECC encoder/decoder 102) is configured to organize (e.g., interleave) input bits 401 into a form of a pseudo triangular matrix 410. The input bits 401 includes input payload 402 and signature bit(s) D1 403 in some examples. The input payload 402 includes the information bits. As described, an example of D1 403 is the extra CRC bits (outer parity bits). The mapping from the input bits 401 to the pseudo triangular matrix 410 is maintained by the controller 110.

As shown, the pseudo triangular matrix 410 has an upper triangular form, which has rows 421-436 (with rows between rows 432 and 433 omitted for clarity) and columns 441-456 (with columns between columns 452 and 453 omitted for clarity). The pseudo triangular matrix 410 is shown to have multiple blocks. Each block in the pseudo triangular matrix 410 includes or otherwise represents two or more bits of the input bits 401. The number of input bits per each block can be predetermined and equal for all the blocks of the pseudo triangular matrix 410. The disclosed implementations allow intersection of two or more common bits for any pair of component codes.

In some implementations, the input bits 401 are mapped to blocks in the pseudo triangular matrix 410 consecutively (by any suitable order). For example, the rows 421-436, in that order or in a reverse order, can be filled by the input bits 401 consecutively block-by-block, from the left-most block of a row to a right-most block of a row, or vice versa. In another example, the columns 441-456, in that order or in a reverse order, can be filled by the input bits 401 consecutively block-by-block, from the top-most block of a column to a bottom-most block of a row, or vice versa. In some implementations, the input bits 401 are mapped to the pseudo triangular matrix 410 pseudo-randomly. In other implementations, the input bits 401 can be mapped to the pseudo triangular matrix 410 using another suitable mapping mechanism.

The blocks, rows, and columns in the pseudo triangular matrix 410 can be grouped together. For example, the pseudo triangular matrix 410 includes a first group of columns 441-444, a second group of columns 445-448, a third group of columns 449-452, . . . , and another group of columns 453-456. The pseudo triangular matrix 410 includes a first group of rows 421-424, a second group of rows 425-428, a third group of rows 429-432, . . . , and another group of rows 433-436. Thus, the HFPC structure is divided into groups of 4 component codes. Every 4 component codes are encoded according to HFPC guidelines. Although 4 component code groups (e.g., 4 rows/columns) are shown in FIG. 4, any number (e.g., 2, 3, 6, 8, 10, 12, 16, and so on) of component codes can be grouped together.

As shown, the upper triangular form has a same number of columns and a same number of rows. The rows (e.g., the rows 421-424) or columns (e.g., the columns 441-444) in a same component code group have a same number of blocks and therefore have a same number of bits. In the upper triangular form, the rows 421-424 contain the most bits out of all the rows in the pseudo triangular matrix 410. Each of the rows 425-428 has one less group of blocks (4 blocks, corresponding to the group of columns 441-444) than any of the rows 421-424. Each of the rows 429-432 has one less group of blocks (4 blocks, corresponding to the group of columns 445-448) than any of the rows 425-428, and so on. Each of the rows 433-436, being the lowest row, has a group of blocks (e.g., 4 blocks). In other words, any row in the pseudo triangular matrix 410 (except for the rows 421-424) has 4 blocks less than a row of a group immediately above. Similarly, in the upper triangular form, each of the columns 441-444, being one of the left-most columns, has a group of blocks (e.g., 4 blocks). Each of the columns 445-448 has one more group of blocks (4 blocks, corresponding to the group of rows 425-428) than any of the columns 441-444. Each of the columns 449-452 has one more group of blocks (4 blocks, corresponding to the group of rows 429-432) than any of the columns 445-448, and so on. Each of the columns 453-456, being the right-most columns, has the most number of blocks. In other words, any column in the pseudo triangular matrix 410 (except for the columns 453-456) has 4 blocks less than a column of a group immediately to the right.

Organizing or mapping the input bits 401 in the upper triangular form of the pseudo triangular matrix 410 allows every component code to be associated with bits in a row and a column that have the same size or nearly the same size in the manner described. The component codes within a same group encode separate sets of the input bits 401 and are independent of each other.

R1 461-R4 464 are redundancy bits determined based on a same group of component codes. R1 461 represents redundancy bits corresponding to a first component code and are obtained by encoding (e.g., folded component encoding) the input bits 401 in a first row (e.g., the bits in the row 421). R2 462, R3 463, and R4 464 represent redundancy bits corresponding to additional component codes and are obtained by encoding (e.g., folded component encoding) the input bits 401 in the bits in the rows 422, 423, and 423, respectively. The bits used to determine each of R1 461-R4 464 do not overlap, and thus R1 461-R4 464 are independently determined.

R5 465, R6 466, R7 467, and R8 468 represent redundancy bits corresponding to additional component codes and are obtained by encoding (e.g., folded component encoding) the input bits 401 in the bits in the column 444 and row 425, in the column 443 and row 426, in the column 442 and row 427, and in the column 441 and row 428, respectively. The bits used to determine each of R5 465-R8 468 do not overlap, and thus R5 465-R8 468 are independently determined.

R9 469, R10 470, R11 471, and R12 472 represent redundancy bits corresponding to additional component codes and are obtained by encoding (e.g., folded component encoding) the input bits 401 in the bits in the column 448 and row 429, in the column 447 and row 430, in the column 446 and row 431, and in the column 445 and row 432, respectively. The bits used to determine each of R9 469-R12 472 do not overlap, and thus R9 469-R12 472 are independently determined.

This process continues until Rn-3 473, Rn-2 474, Rn-1 475, and Rn 476 are determined. Rn-3 473, Rn-2 474, Rn-1 475, and Rn 476 represent redundancy bits corresponding to additional component codes and are obtained by encoding (e.g., folded component encoding) the input bits 401 in the bits in the column 456, in the column 455, in the column 454, and in the column 453, respectively. The bits used to determine each of Rn-3 473, Rn-2 474, Rn-1 475, and Rn 476 do not overlap, and thus Rn-3 473, Rn-2 474, Rn-1 475, and Rn 476 are independently determined. An example of the folded component encoding is folded BCH encoding.

In the special case that the component codes are divided into two groups of independent component codes, the resulting coding scheme degenerates to a folded product code.

According to the mapping 400, the input bits 401 are mapped to the component codes of the ECC and are encoded as the mapped component codes. For example, the encoding process organizes or maps the input bits 401 in a matrix (e.g., a pseudo triangular matrix form), and performs folded BCH encoding for every component code. Each of the input bits 401 is encoded by two component codes of different component code groups. Thus, any component code intersects with all other component codes that are in the same group as the group to which that component code belongs. For component codes that encode the input bits 401, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 469 redundancy bits are also encoded by other component codes corresponding to R1 461-R8 468 and R11-Rn 476 that are not in the group in which the component code corresponding to R9 469 redundancy bits belongs. Each block of bits encoded by any of the component code (e.g., the component code corresponding to the R9 469) is encoded by that component code (e.g., the component code corresponding to the R9 469) and no more than another one of the component codes, hence in a non-overlapping manner. As such, every component code is mutually dependent on all other component codes that are not within the same group. The component codes together provide the encoding of each input bits 401 using two component codes.

In some implementations, parity bits can be generated via parity encoding. For example, folded parity encoding can be used to encode at least a portion of each of R1 461-Rn 476 into another component code (e.g., a folded product code 480, which is a set of packets). The folded product code 480 (e.g., having Rp1-Rp3) is the parity bits. This method of generating the parity bits can be efficient for obtaining simple hardware encoding implementations of HFPC, as the method can be iteratively decoded using various methods of hard or soft decoding.

While a hard decoder decodes a message based on received bits (based on hard decision), soft input can be obtained by soft sampling, e.g., performing multiple reads from a flash device, where each read operation uses a different one of the read thresholds. The read thresholds can be configured such that soft information or soft metrics such as but not limited to, a log-likelihood ratio (LLR), can be computed per bit. An LLR is defined as:

$$LLR(b_i) = \log\left(\frac{P(b_i = 1 \mid y)}{P(b_i = 0 \mid y)}\right); \quad (5)$$

where y is a channel output and $b_i$ is the $i^{th}$ bit of a page. The LLR expression can be substantially simplified in some examples, for an additive white Gaussian noise (AWGN) channel model. The AWGN can be used to approximate lobes' distribution in a flash device. By assuming an AWGN channel, $$P(b_i \mid y) = \frac{1}{\sqrt{2\pi\sigma^2}} \exp\left(-\frac{(y - b_i)^2}{2\sigma^2}\right); \quad (6)$$

where y is the AWGN channel output. Therefore, in some examples, the $LLR(b_i)$ becomes:

$$LLR(b_i) = \frac{2y}{\sigma^2}; \quad (7)$$

where the LLR per bit is created during multiple flash reads, as a quantized version of an AWGN channel. In some arrangements, the quantization level per threshold can be directly determined by the number of reads, as a base-two logarithm of a read counter.

After multiple reads have been conducted, and once LLRs are available for all codeword bits, a decoding process may begin. There can be many possible approximations for mapping of LLR values' for implementation efficiency, such as mapping to fixed point integer values. A product code corresponds to an n×n array in which each column and row is a codeword in component code. Several known decoding algorithms can be used for a product code when soft information is available to a decoder. The general approach includes decoding each component code separately to generate output reliabilities per bit, which is applied and used for iterative decoding of the component code. For example, soft decoding of a BCH component code needs soft information per bit. Iterative soft decoding includes a process of performing soft decoding on some of component codes, and applying the most likely corrections under different conditions. One approach for soft decoding is enumeration over low reliability bits, while trying to solve the BCH code per hypothesis. Other approaches include enumeration on least reliable bits together with assumptions that all errors are within a set of Q×t bits and performing erasure decoding, where t is the number of correctable bits (e.g., t=3), Q stands for the Galois field ($2^Q$) that is used for the code elements (e.g., Q=10). Q and t are parts of the parameters of the code, and Q×t is the number of parity bits of the codeword. This approach is known as ordered statistics decoding.

If the BCH component codes with decoding capability of t<4 are used, soft decoding can be efficiently implemented in terms of computational complexity, or implemented in hardware implementation, as per hypothesis a solution can directly be computed using a syndrome lookup table (LUT). Performing any type of soft decoding for a component code includes creating a list of candidates of the most likely error hypotheses for valid codeword corrections. A soft score for every result of valid codeword can be computed by $$S_{LLR} = \sum_{b_m \in C} |LLR(b_m)|; \quad (8)$$

where C is the set of error bits, and $b_m$ is a location of an error bit. In some examples, the selected error hypothesis of a soft component decoder has the smallest $S_{LLR}$ score.

Figure 5:
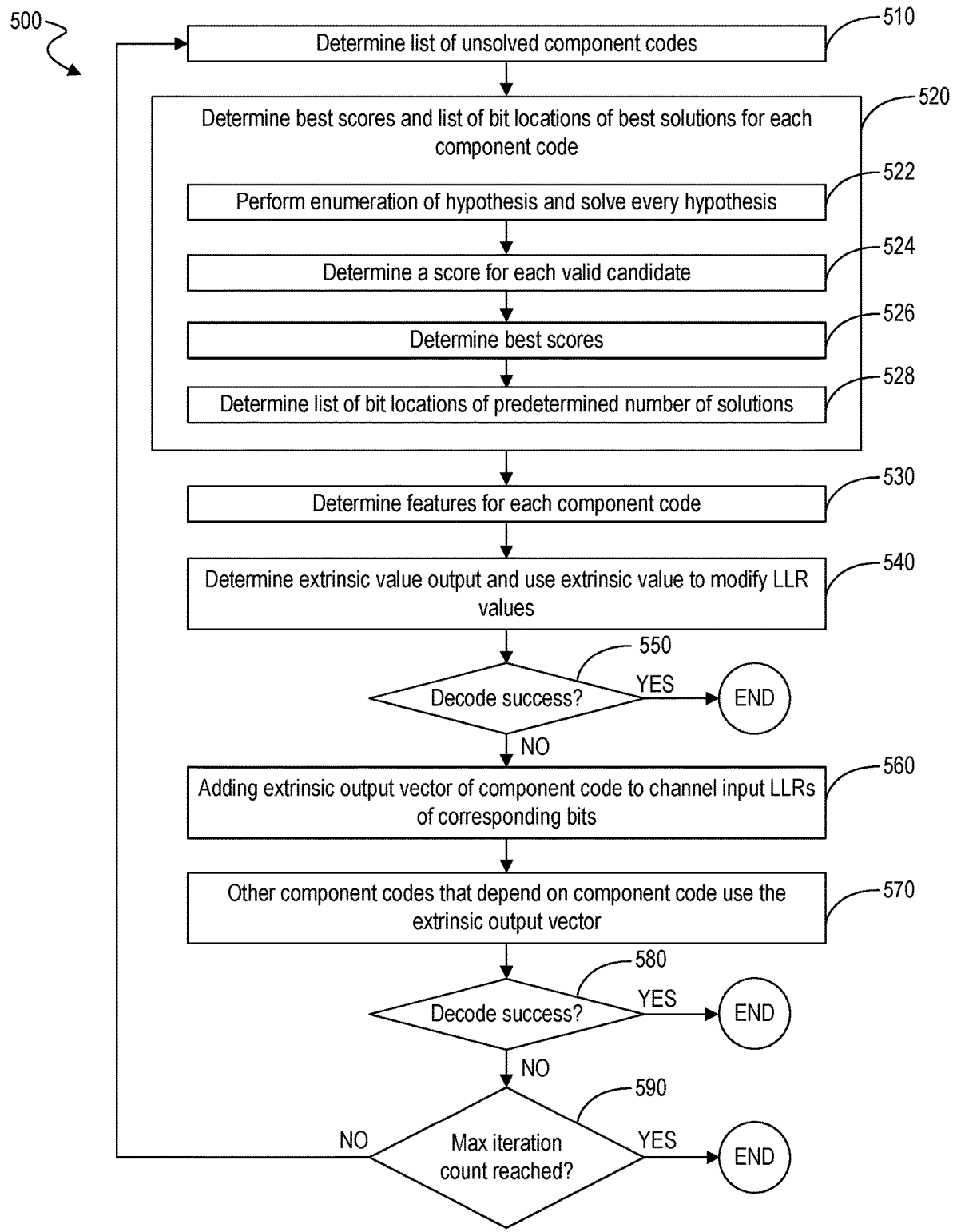
FIG. 5 is a process flow diagram illustrating an example iterative joint soft decoding method, according to some implementations.

FIG. 5 is a process flow diagram illustrating an example iterative joint soft decoding method 500, according to some implementations. Referring to FIGS. 1-5, the iterative joint soft encoding method 500 can be performed on data encoded using the HFPC code structure and has improved performance and reliability over conventional soft decoding methods. In some arrangements, the HFPC code structure is composed of multiple component codes. Each component code can be, for example, a BCH code.

At 510, one or more decoders of the ECC encoder/decoder 102 or 112 determine a list of unsolved component codes. In some examples, the one or more decoders of the ECC encoder/decoder 102 or 112 selects component codes (e.g., BCH codes) each having a non-zero syndrome to be included in the list.

At 520, the one or more decoders of the ECC encoder/decoder 102 or 112 determine best scores and a list of bit locations of best solutions for each unsolved component code in the list created at 510. In some examples, block 520 corresponds to decoding a component code. Block 520 includes at least blocks 522, 524, 526, and 528.

At 522, the one or more decoders of the ECC encoder/decoder 102 or 112 performs enumeration of hypotheses for each unsolved component code, and solves every hypothesis to generate solutions. Each solution corresponds to a hypothesis and indicates one or more bits in each component code to be corrected. Block 522 can be performed by a BCH solver of the one or more decoders of the ECC encoder/decoder 102 or 112.

At 524, the one or more decoders of the ECC encoder/decoder 102 or 112 determines a score for each solution or for each valid candidate. Valid candidates are a subset of the solutions determined at block 522 that have the highest likelihood of providing valid codeword corrections of the unsolved component code. In some examples, a valid candidate for a BCH component code may include a vector of suggested bits which generate a zero syndrome by flipping the hard decision on the specified bit-vector locations. The score for each valid candidate can be a soft score $S_{LLR}$ (C) determined using expression (8).

At 526, the one or more decoders of the ECC encoder/decoder 102 or 112 determines the best scores among the scores for the valid candidates. In some examples, two best scores $S_1$ (the best score) and $S_2$ (the second best score) can be determined and saved. The two best scores $S_1$ and $S_2$ are the lowest scores. $S_1$ can be determined using:

$$S_1 = \min_{C \in L} S_{LLR}(C); \text{ and} \qquad (9)$$

$$C_{ML} = \operatorname*{argmin}_{C \in L} S_{LLR}(C); \qquad (10)$$

where L is the list of valid candidates, and $C_{ML}$ represent the valid candidate that is most likely the valid codeword correction. $S_2$ can be determined using:

$$S_2 = \min_{C \in L, C \neq C_{ML}} S_{LLR}(C). \qquad (11)$$

At 528, the one or more decoders of the ECC encoder/decoder 102 or 112 determine the list of bit locations L of a predetermined number (N) of solutions. In some examples, the N solution are N best solutions, where the N best solutions are the solutions out of all the solutions for the component code that has the lowest scores $S_i$, where i=1, 2, ..., N. As disclosed, $S_1$ and $S_2$ are the best score (lowest) and the second best score (second lowest), respectively. SN is the highest score.

At 530, the one or more decoders of the ECC encoder/decoder 102 or 112 determines one or more features for each unsolved component code in the list created at 510. Block 530 can be performed in response to block 520 being completed. The features can be used to determine multi-component input variables used in the generalized extrinsic function. The one or more features include but are not limited to, L, the best scores (e.g., $S_1$ and $S_2$), among other parameters.

In some examples, the one or more features include $V_1$, defined as a number of agreed error locations, where the best solution (having a score of $S_1$) of each component code agrees with other component codes to fix the agreed error locations. Given that two or more component codes can intersect at the same bits of the data, the two or more component codes may have corresponding solutions that agree in proposing to fix a same bit at which the component codes intersect. For the purposes of determining $V_1$, the solutions of other component codes correspond to those having a score of $S_1$. In other words, the error locations indicated in solutions having a score of $S_1$ for the component codes are used in determining $V_1$.

In some examples, the one or more features include $V_2$, defined as a number of packets that have a zero syndrome, which the solution corresponding to the score of $S_1$ proposes to change. Packets correspond to units of data that have the same data size, where packets are used to carry the stored encoded data (e.g., the component codes) from the memory array 120 to the one or more decoders of the ECC encoder/decoder 102 or 112.

In some examples, the one or more features include $V_3$, defined as a number of agreed error locations, where the second best solution (having a score of $S_2$) of each component code agrees with other component codes to fix the agreed error locations. For the purposes of determining $V_3$, the solutions of other component codes correspond to those having a score of $S_1$. In other words, the error locations indicated in solutions having a score of $S_1$ for the other component codes and in solutions having a score of $S_2$ for the present component code are used in determining $V_3$.

In some examples, the one or more features include $V_4$, defined as a number of agreed error locations, where the best solution (having a score of $S_1$) of each component code agrees with other component codes to fix the agreed error locations. For the purposes of determining $V_4$, the solutions of other component codes correspond to those having a score of $S_1$ (e.g., the best solution), where the other component codes each has a bit value LLR input higher than a threshold $TH_{ag}$. The number of agreements counted here are between bit-locations associated with bit-flips defined by valid first candidates with score $S_1$ (component). Agreements are counted only for bit locations associated with input LLR which is higher than THag. For input LLRs distributed between 0, ..., 16, an example THag is THag=5.

At 540, the one or more decoders of the ECC encoder/decoder 102 or 112 determines an extrinsic value output and use the extrinsic value to modify the channel LLR values that are used by all other component codes. In some arrangements, the extrinsic value output is determined for a most likely codeword $C_{ML}$ corresponding to the most likely solution (e.g., with a score of $S_1$) for each component code.

An input LLR value can be modified using the extrinsic value to determine a modified LLR value. In some examples, the modified LLR value has a sign that is the same as the sign of the input LLR value. In some examples, the sign of the input LLR value is flipped in one or more bit locations specified in $C_{ML}$ to obtain the modified LLR value. The updated sign vector of the codeword corresponding to the component code is denoted by S.

In some arrangements, the extrinsic value output can be determined based on the one or more features for each component code. For example, a generalized extrinsic function that takes into account the one or more features can reflects a confidence level associated with each output bit of $C_{ML}$:

$$\underline{E}(S_1, S_2, \underline{L}, V_1, V_2, V_3, V_4) \qquad (12).$$

Unlike a scalar value, e.g., $e(S_1 S_2)$, computed for sequential soft decoding, the generalized extrinsic function, which is a vector, can allocate lower reliability/confidence level to bit locations included in the vector L and higher reliability/confidence level to other bit locations. The generalized extrinsic function also depends on decoding results of other component codes, by including from consideration $V_1$, $V_2$, $V_3$, and $V_4$. For example, the generalized extrinsic function can allocate higher reliability/confidence to bit locations for which the solution corresponding to $C_{ML}$ agree with other component codes. Accordingly, the extrinsic output vector can be represented by:

$$\underline{E}(S_1, S_2, \underline{L}, V_1, V_2, V_3, V_4) \cdot S \quad (13).$$

At 550, the one or more decoders of the ECC encoder/decoder 102 or 112 determines whether decode is successful after determining the extrinsic value output (e.g., after decoding extrinsic update) for each component code. This is because blocks 520-540 are performed with respect to each component code. In response to determining that the decoding is successful (550:YES), the method 500 ends. On the other hand, in response to determining that the decoding is not successful (550:NO), the one or more decoders of the ECC encoder/decoder 102 or 112 add the extrinsic output vector of each component code to the channel input LLRs of bits corresponding to the extrinsic output vector, at 560. At 570, the one or more decoders of the ECC encoder/decoder 102 or 112 use the channel input LLRs in decoding all other component codes that are dependent on bit locations of the codeword.

At 580, the one or more decoders of the ECC encoder/decoder 102 or 112 determines whether decode is successful after decoding each component code is completed. In response to determining that the decoding is successful (580:YES), the method 500 ends. On the other hand, in response to determining that the decoding is not successful (580:NO), the one or more decoders of the ECC encoder/decoder 102 or 112 determines whether a max iteration count has been reached, at 590. In response to determining that the max iteration count has been reached (590:YES), the method 500 ends. On the other hand, in response to determining that the max iteration count has not been reached (590:NO), the method 500 returns to 510, in which a new list of unsolved component codes is created.

Figure 6:
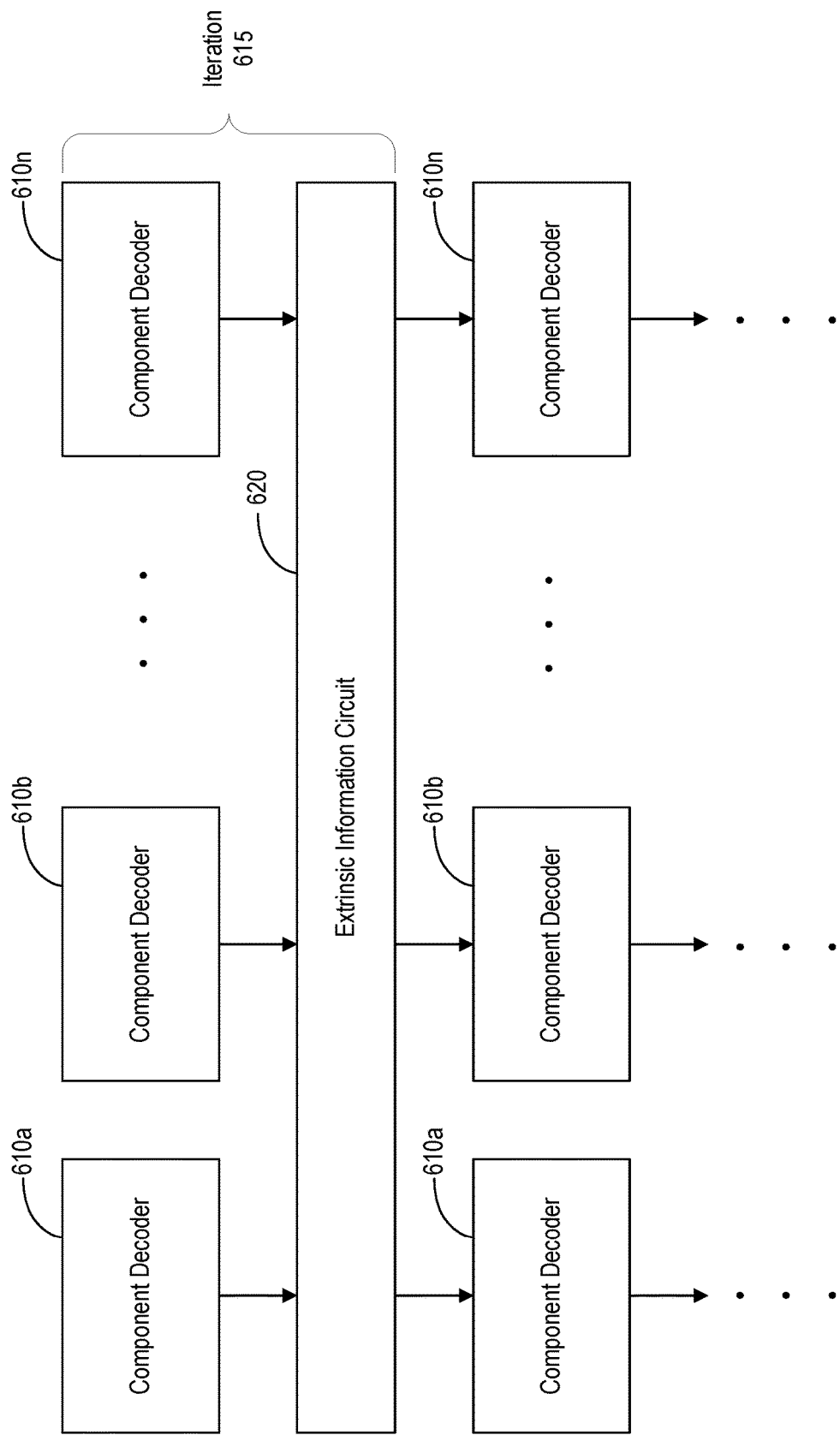
FIG. 6 is a diagram illustrating the example iterative joint soft decoding method of FIG. 5, according to some implementations.

FIG. 6 is a diagram illustrating the example iterative joint soft decoding method 500 of FIG. 5, according to some implementations. Referring to FIGS. 1-6, the one or more decoders of the ECC encoder/decoder 102 or 112 can implement component decoders 610a, 610b, . . . , 610n and an extrinsic information circuit 620. Each of the component decoders 610a-610n can be implemented using separate hardware or firmware. Each of the component decoders 610a-610n is a soft decoder and can decode a component code.

Within one iteration (e.g., iteration 615), each unsolved component code is decoded by a corresponding one of the component decoders 610a-610n. For example, each of the component decoders 610a-610n performs blocks 520 and 530 using data corresponding encoded component code (read from the memory array 120) and a corresponding extrinsic output vector as input. Each of the component decoders 610a-610n outputs the features determined at block 530 to the extrinsic information circuit 620. As described, the features include $S_1$, $S_2$, $\underline{L}$, $V_1$, $V_2$, V3, and V4.

Based on the features for each component code, the extrinsic information circuit 620 determines the extrinsic value output (by performing safe extrinsic information computation) for each component code and uses the extrinsic value to modify the LLR values, at 540. After block 540 is performed, in some examples, the extrinsic information circuit 620 determines whether decode is successful, at 550.

If decode is not successful (550:NO), in the next iteration following the iteration 615, a new list of unsolved component codes can be generated, e.g., at 510, and the extrinsic information circuit 620 provides the extrinsic value output (e.g., the extrinsic output vector) determined for each component code to all of the component decoders 610a-610n that process other component codes that depend on each component code. Each of the component decoders 610a-610n can perform blocks 520 and 530 for a corresponding component code based on the updated extrinsic value outputs of other component codes on which that component code depend, and so on, as described. In the HFPC structure, all components may depend on one another, and can therefore benefit from the updated extrinsic values of each other. As shown, the extrinsic value output for all of the unsolved component codes are determined in one iteration, before the next iteration begins. When the component decoders 610a-610n are decoding each component code (e.g., at blocks 520 and 530), the extrinsic values are static and are not updated.

The iterative joint soft decoding method 500 has improved reliability as compared to direct sequential decoding and allows straightforward parallel implementation on hardware, given that the update of extrinsic values is performed at the end of each iteration. The LLRs used in each iteration are determined from the previous iteration. The parallel implementation refers to simultaneous component soft decoding for multiple component codes during a given iteration.

Figure 7:
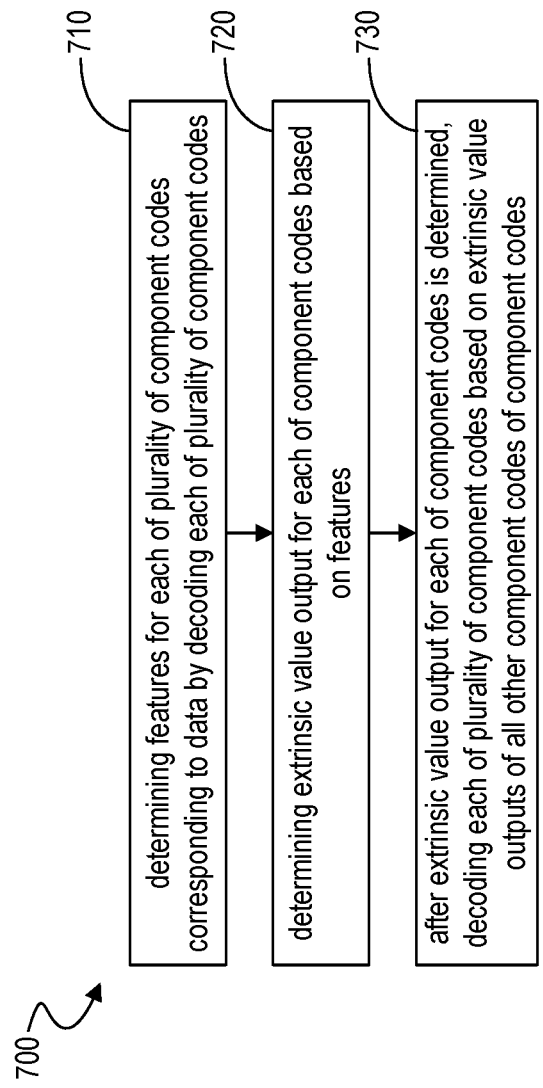
FIG. 7 is a process flow diagram illustrating an example iterative joint soft decoding method, according to some implementations.

FIG. 7 is a process flow diagram illustrating an example iterative joint soft decoding method 700, according to some implementations. Referring to FIGS. 1-7, the iterative joint soft encoding method 700 can be performed on data encoded using the HFPC code structure and has improved performance and reliability over conventional soft decoding methods. In some arrangements, the HFPC code structure is composed of multiple component codes. Each of the component codes depends on all other component codes. Each component code can be, for example, a BCH code. The iterative joint soft decoding method 500 is an example implementation of the iterative joint soft decoding method 700.

At 710, in a first iteration (e.g., the iteration 615), the component decoders 610a-610n determines features for each of the plurality of component codes used to encode a given data payload. In some examples, each of the component decoders 610a-610n determines the features for a corresponding one of the plurality of component codes at blocks 520 and 530. At 720, in the first iteration (e.g., the iteration 615), the extrinsic information circuit 620 determines the extrinsic value output for each of the component codes based on the features (e.g., as described at 540). At 730, in the next iteration (e.g., the iteration immediately following the iteration 615), and after the extrinsic value output for each and all of the component codes has been determined, the component decoders 610a-610n decodes each of the plurality of component codes based on the extrinsic value outputs of all other component codes of the component codes (determined at 720).

Accordingly, the arrangements disclosed herein relate to soft decoding schemes with improved error correction capabilities. For example, the arrangements disclosed herein allow the correction of high bit error rate (BER) with soft decoding, with relatively low implementation complexity. Efficient hardware implementation can be achieved using the soft decoding schemes. In addition, by using the extrinsic information calculation approach for component decoding within a generalized product code, improved reliability can be achieved using the soft decoding schemes, which includes parallel component decoding, using a multi-variable generalized function for computing an extrinsic value from each component code, detecting one of the suggested solutions in the component output to be used according to observations of other component codes, and allocating distinct LLR values to different component groups of bits. Furthermore, joint component soft decoding improves reliability (e.g., correction of higher BER) while allowing a highly parallel hardware implementation. Given that the extrinsic information is updated only once per iteration, all soft processing of multiple component codes can be implemented in parallel on hardware. Relative to decoding the data encoded using the ECC structures described herein, iterative soft decoding for HFPC can be efficiently provided by computing and applying extrinsic information for every decoded component within an iterative decoding flow.

Further disclosure of the HFPC ECC structure and decoding scheme related thereto can be found in U.S. patent application Ser. No. 16/355,559, titled "Error Correction Code Decoder," filed on Mar. 15, 2019, and U.S. patent application Ser. No. 16/355,555, titled "Decoding Scheme for Error Correction Code Structure," filed on Mar. 15, 2019, the entire contents of which are hereby incorporated by reference. Further disclosure of codeword concatenation scheme can be found in Ser. No. 16/844,725, titled "CODEWORD CONCATENATION FOR CORRECTING ERRORS IN DATA STORAGE DEVICES," filed on Apr. 9, 2020, the entire content of which are hereby incorporated by reference.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for decoding data stored in a non-volatile storage device, comprising:
   determining features for each of a plurality of component codes corresponding to the data by decoding each of the plurality of component codes;
   determining an extrinsic value output for each of the component codes based on the features; and
   after the extrinsic value output for each of the component codes is determined, decoding each of the plurality of component codes based on the extrinsic value outputs of all other component codes of the component codes, wherein each of the component codes depends on all other component codes.

2. The method of claim 1, wherein each of the plurality of component codes is a Bose-Chaudhuri-Hocquenghem (BCH) code.

3. The method of claim 1, wherein decoding each of the plurality of component codes comprises:
   determining best scores for each of the plurality of component codes; and
   determining a list of bit locations for a number of solutions of each of the plurality of component codes.

4. The method of claim 3, wherein determining the best scores for each of the plurality of component codes comprises:
   performing enumeration of hypotheses and generating a solution for each of the plurality of component codes by solving every hypothesis for each of the plurality of component codes;
   determining a score for each solution of each of the plurality of component codes; and
   determining a number of best scores for each of the plurality of component codes.

5. The method of claim 4, wherein the number of solutions are the number of best solutions based on the score of each solution of each of the plurality of component codes.

6. The method of claim 5, wherein the number of best solutions and the number of best scores are different numbers.

7. The method of claim 3, wherein the features comprise the best scores for each of the plurality of component codes and the list of bit locations for the number of solutions.

8. The method of claim 1, wherein
   the features comprise a number of agreed error locations; and
   a best solution of each of the plurality of component codes agrees with a best solution of others of the plurality of components on the agreed error locations.

9. The method of claim 1, wherein the features comprise a number of packets that have a zero syndrome that a best solution of each of the plurality of component codes proposes to change.

10. The method of claim 1, wherein
    the features comprise a number of agreed error locations; and
    a second best solution of each of the plurality of component codes agrees with a best solution of others of the plurality of components on the agreed error locations.

11. The method of claim 1, wherein
    the features comprise a number of agreed error locations;
    a best solution of each of the plurality of component codes agrees with a best solution of some of the plurality of components on the agreed error locations; and
    each of the some of the plurality of components has a bit value log-likelihood ratio (LLR) input higher than a threshold.

12. The method of claim 1, wherein the extrinsic value output comprises an extrinsic function that is a vector.

13. The method of claim 1, further comprising determining a list of unsolved component codes, the plurality of component codes are in the list of unsolved component codes.

14. The method of claim 13, wherein each of the unsolved component codes has a non-zero syndrome.

15. An error correction system, comprising processing circuits configured to:
    determine features for each of a plurality of component codes corresponding to the data by decoding each of the plurality of component codes;
    determine an extrinsic value output for each of the component codes based on the features; and
    after the extrinsic value output for each of the component codes is determined, decode each of the plurality of component codes based on the extrinsic value outputs of all other component codes of the component codes, wherein each of the component codes depends on all other component codes.

16. The error correction system of claim 15, wherein each of the plurality of component codes is a Bose-Chaudhuri-Hocquenghem (BCH) code.

17. The error correction system of claim 15, wherein decoding each of the plurality of component codes comprises:
    determining best scores for each of the plurality of component codes; and
    determining a list of bit locations for a number of solutions of each of the plurality of component codes.

18. The error correction system of claim 17, wherein determining the best scores for each of the plurality of component codes comprises:
    performing enumeration of hypotheses and generating a solution for each of the plurality of component codes by solving every hypothesis for each of the plurality of component codes;
    determining a score for each solution of each of the plurality of component codes; and determining a number of best scores for each of the plurality of component codes.

19. The error correction system of claim 17, wherein the features comprise:
- the best scores for each of the plurality of component codes;
- the list of bit locations for the number of solutions;
- a number of first agreed error locations, a best solution of each of the plurality of component codes agrees with a best solution of others of the plurality of components on the first agreed error locations;
- a number of packets that have a zero syndrome that the best solution of each of the plurality of component codes proposes to change;
- a number of second agreed error locations, a second best solution of each of the plurality of component codes agrees with the best solution of others of the plurality of components on the second agreed error locations; and
- a number of third agreed error locations, the best solution of each of the plurality of component codes agrees with a best solution of some of the plurality of components on the agreed error location, each of the some of the plurality of components having a bit value log-likelihood ratio (LLR) input higher than a threshold.

20. A non-transitory computer-readable medium storing computer-readable instructions, such that when executed, causes a processing circuit to decode data stored in a non-volatile storage device by:
- determining features for each of a plurality of component codes corresponding to the data by decoding each of the plurality of component codes;
- determining an extrinsic value output for each of the component codes based on the features; and
- after the extrinsic value output for each of the component codes is determined, decoding each of the plurality of component codes based on the extrinsic value outputs of all other component codes of the component codes, wherein each of the component codes depends on all other component codes.

* * * * *